United States Patent
Guo et al.

(10) Patent No.: US 12,372,574 B2
(45) Date of Patent: Jul. 29, 2025

(54) SKEW DETECTION AND COMPENSATION FOR HIGH SPEED I/O LINKS

(71) Applicant: Intel Corporation, Santa Clara, CA (US)

(72) Inventors: Jong-Ru Guo, Portland, OR (US); Jingbo Li, Portland, OR (US); Xiaoning Ye, Portland, OR (US); Zuoguo Wu, San Jose, CA (US); Howard L. Heck, Tigard, OR (US)

(*) Notice: Subject to any disclaimer, the term of this patent is extended or adjusted under 35 U.S.C. 154(b) by 885 days.

(21) Appl. No.: 17/353,453

(22) Filed: Jun. 21, 2021

(65) Prior Publication Data

US 2021/0311120 A1    Oct. 7, 2021

(51) Int. Cl.
*G01R 31/317* (2006.01)
*H04L 25/02* (2006.01)

(52) U.S. Cl.
CPC . *G01R 31/31725* (2013.01); *G01R 31/31706* (2013.01); *H04L 25/0276* (2013.01)

(58) Field of Classification Search
CPC ........ G01R 31/31725; G01R 31/31706; H04L 25/0276; H04L 25/03006; G05F 1/62
See application file for complete search history.

(56) References Cited

U.S. PATENT DOCUMENTS

| | | | |
|---|---|---|---|
| 6,946,907 B2* | 9/2005 | Tai | H03F 3/45937 330/69 |
| 7,893,746 B1* | 2/2011 | Zheng | H03H 11/26 327/263 |
| 2006/0244505 A1* | 11/2006 | Fung | G06F 1/10 327/293 |
| 2010/0295591 A1* | 11/2010 | Asmanis | H04L 25/03878 327/276 |
| 2014/0203798 A1* | 7/2014 | O'Mahony | G01R 31/31726 324/76.82 |
| 2016/0033455 A1* | 2/2016 | Knierim | G01R 1/06766 73/1.82 |
| 2018/0074125 A1* | 3/2018 | Min | G01R 19/10 |

OTHER PUBLICATIONS

Lai Mauro et al., "Skew metric and BER testing correlation for NRZ/PAM4 signaling," Intel Corporation, 2019 (23 pages).

* cited by examiner

*Primary Examiner* — Jaweed A Abbaszadeh
*Assistant Examiner* — Brynne J. Corcoran
(74) *Attorney, Agent, or Firm* — Haley Guiliano LLP

(57) ABSTRACT

An apparatus may comprise a skew detection circuit to sample a common mode voltage of a differential signal, wherein the sampled common mode voltage is indicative of an amount of skew between a first signal of the differential signal and a second signal of the differential signal; and a skew compensation circuit to adjust a delay of the first signal or the second signal based on the sampled common mode voltage to reduce the amount of skew.

17 Claims, 8 Drawing Sheets

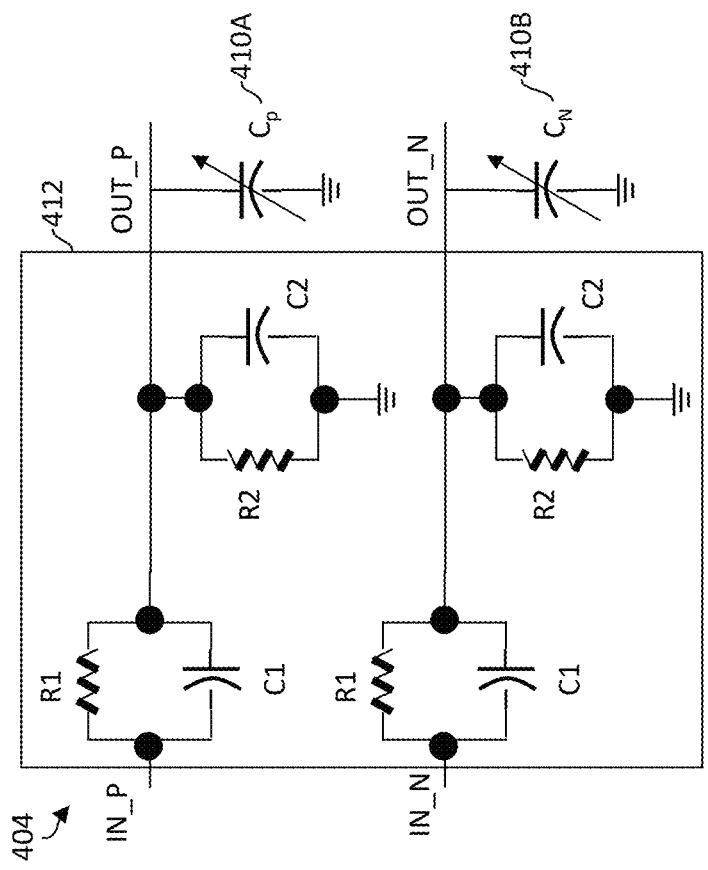
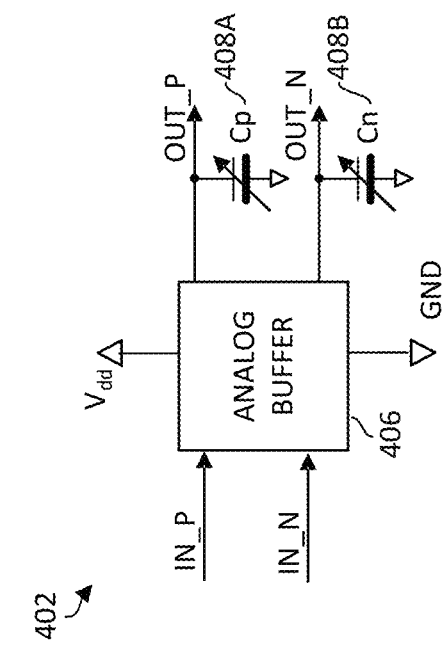
FIG. 4A
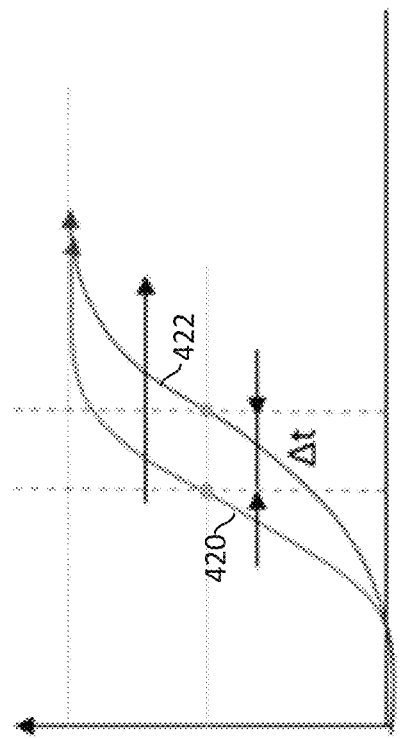
FIG. 4B
FIG. 4C

SKEW DETECTION AND COMPENSATION FOR HIGH SPEED I/O LINKS

FIELD

The present disclosure relates in general to the field of computer development, and more specifically, skew detection and compensation for high speed I/O links.

BACKGROUND

A host may communicate with a device via various communication paths. A communication path may comprise one or more wires or other transmission media of the cable.

BRIEF DESCRIPTION OF THE DRAWINGS

FIGS. 4A-4B illustrate skew compensation circuits in accordance with certain embodiments.

FIG. 4C illustrates an effect of skew compensation in accordance with certain embodiments.

Like reference numbers and designations in the various drawings indicate like elements.

DETAILED DESCRIPTION

Figure 1:
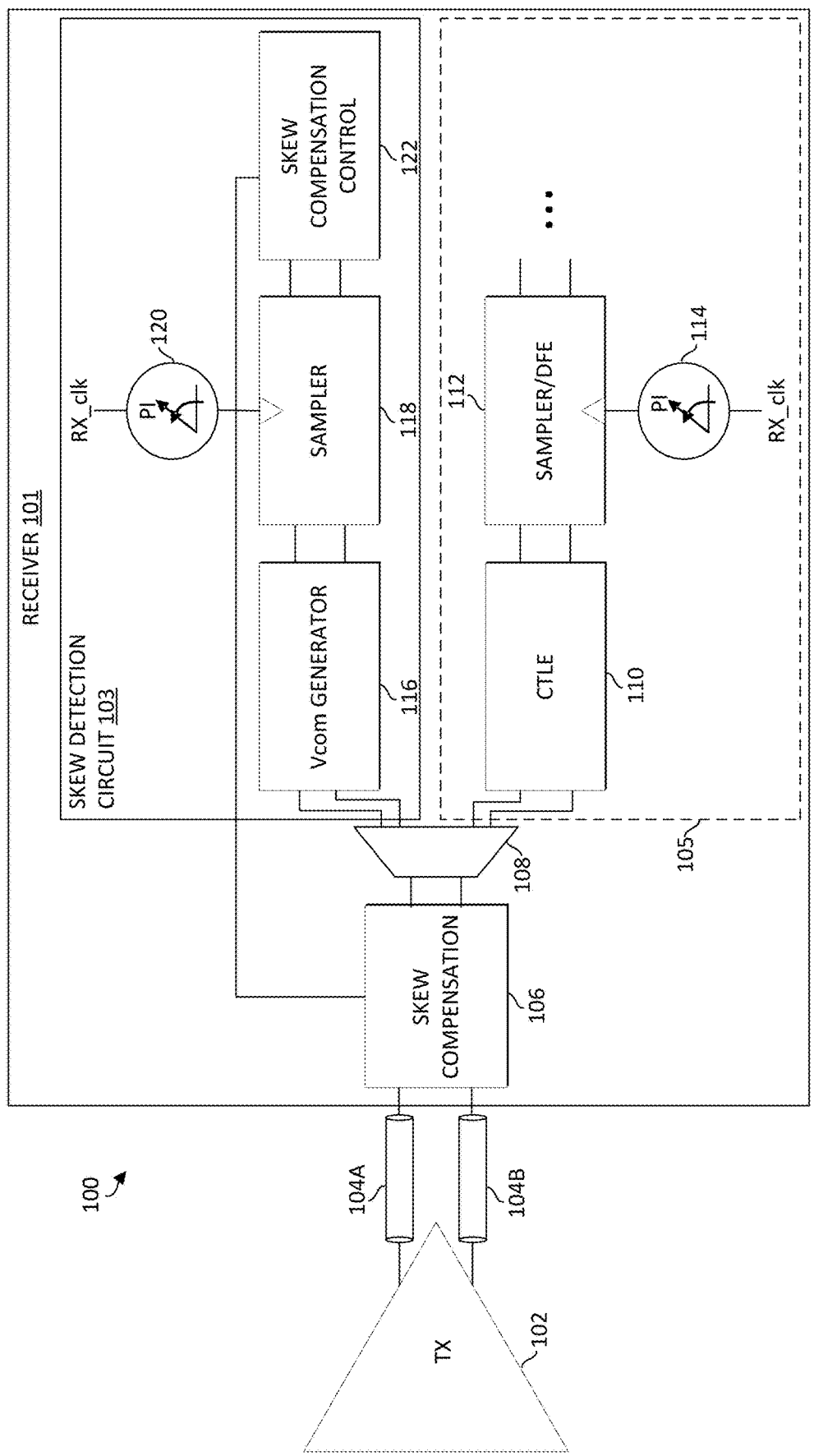
FIG. 1 illustrates a system for skew detection and compensation in accordance with certain embodiments.

FIG. 1 illustrates a system 100 for skew detection and compensation in accordance with certain embodiments. System 100 includes a transmitter 102 that transmits a differential signal over communication paths 104 (e.g., 104A and 104B) to a receiver 101, where one signal of the differential signal passes through communication path 104A and the other signal of the differential signal passes through communication path 104B. A communication path 104 may refer to one or more communication medium(s) and/or other circuitry that enables communication between a source (e.g., transmitter) and a destination (e.g., receiver). For example, a communication path 104 may include portions of an integrated circuit package, a printed circuit board, a connector, a cable, one or more conductive wires, or other communication mediums.

High-speed input/output (IO) interfaces (e.g., Peripheral Component Interconnect Express (PCIe), Ethernet, Universal Serial Bus (USB)) generally utilize differential signaling for data transfer. By carrying a data signal with opposite polarities (P & N) on two channels, differential signals are more immune to system noise and double the signal amplitude at the receiver.

Figure 2B:
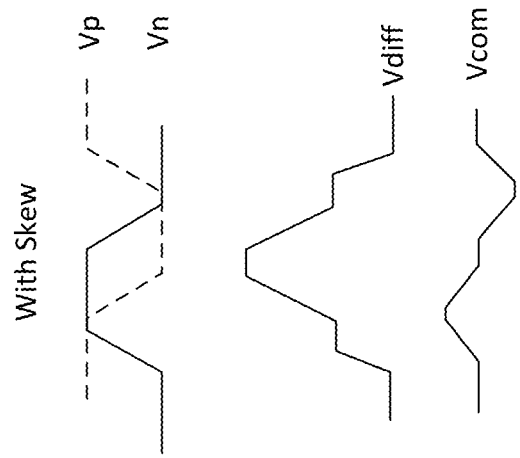
FIGS. 2A-2B illustrate effects of skew in accordance with certain embodiments.
Figure 2A:
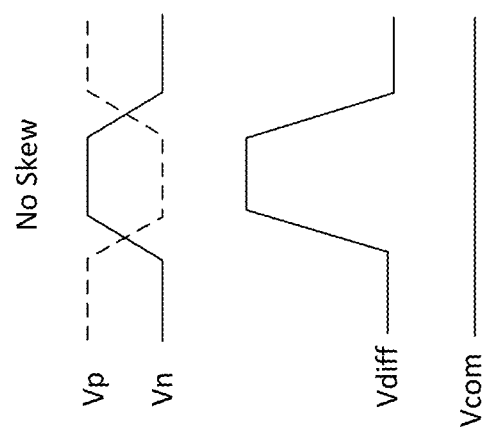

FIG. 2A illustrates a differential data signal (Vdiff) in which the P signal (Vp) and N signal (Vn) are perfectly aligned with zero skew due to matched P and N channels. The differential signal Vdiff is equal to the difference between Vp and Vn. When there is no skew, Vdiff is maximized and at its peak is twice the amplitude of each single ended signal. The common mode signal Vcom which is equal to 0.5*(Vp+Vn) is a DC constant when there is no skew.

FIG. 2B illustrates a differential data signal (Vdiff) in which skew is present between Vp and Vn due to a mismatch between the P and N channels. The presence of skew distorts the differential signal Vdiff with a ledge effect. Part of the differential signal will be converted to common mode signal Vcom, which results in distortion of the differential signal as well as common mode noise.

FIGS. 3A-3D illustrate various skew types in accordance with certain embodiments. Each of these FIGs. depict Vp, Vn, Vdiff, and Vcom for various types of skew.

Figure 3A:
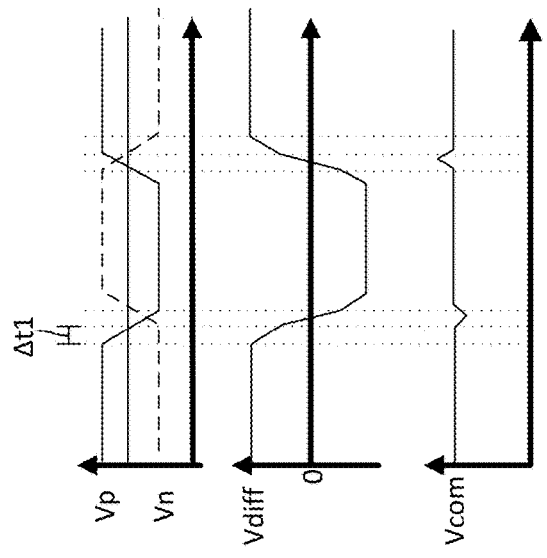
FIGS. 3A-3D illustrate various skew types in accordance with certain embodiments.

In FIG. 3A, the ideal case of no skew between Vp and Vn is shown. In this case, Viff has no distortion and Vcom is a constant.

Figure 3B:
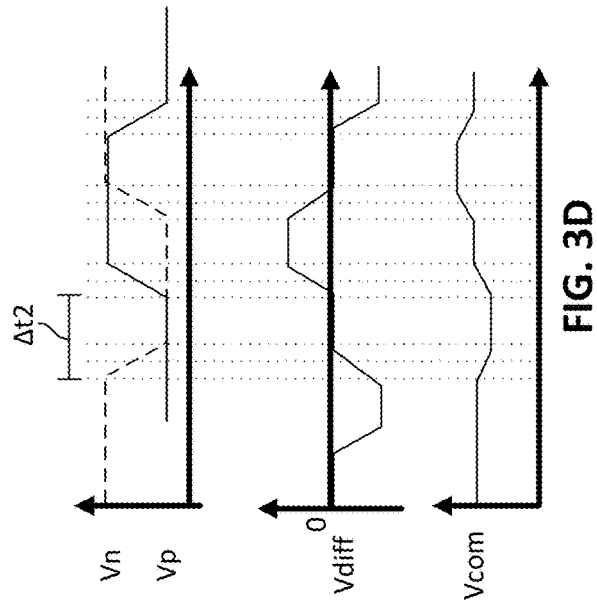

In FIG. 3B, Vn is skewed slightly by Δt1 relative to Vp. In this case, Vdiff is distorted as differential mode noise is present. Some common mode noise is present in Vcom and thus Vcom is not constant throughout the waveform.

Figure 3C:
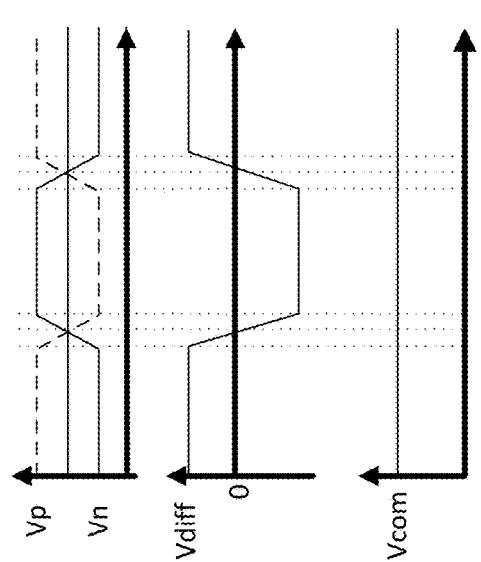

In FIG. 3C, Vn is delayed relative to Vp by Δt2 (where Δt2 is larger in magnitude than Δt1). In this instance, significant signal distortion is observed in Vdiff, which may result in a potential jitter issue and degradation of the interconnect's performance. Significant common mode noise is also observed in Vcom which would also lead to differential mode noise. The noise amplitude in FIG. 3C is larger than the noise amplitude in FIG. 3B.

Figure 3D:
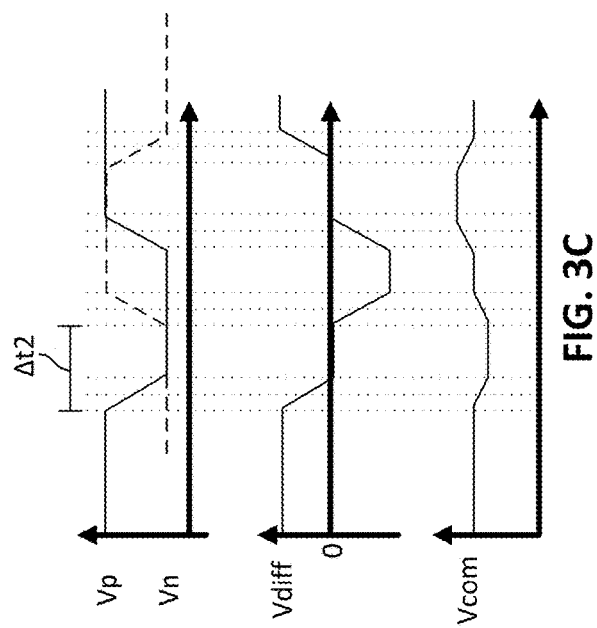

In FIG. 3D, Vp is delayed relative to Vn by Δt2. Again, significant signal distortion is present in Vdiff and significant jitter would appear. The shape and amplitude of the common mode noise in Vcom is similar to that in FIG. 3C.

As the waveforms indicate, as the skew increases, the differential signal is further distorted, which has a significant impact on the performance of a high speed I/O interconnect. As the skew increases, the amplitudes of the deviations of the common mode signal Vcom from the ideal straight line Vcom also increases.

Due to design limitations and manufacturing tolerances, this P and N mismatch (also referred to as PN skew) is very difficult to avoid and may be present in various components within the communication paths 104, such as integrated circuit packages, printed circuit boards, connectors, a cable, or other communication mediums. The total PN skew is the summation of the skew from each individual component. The PN skew degrades the signal quality due to distortion of the differential signal and common mode noise. As IO interfaces evolve to higher speeds, the PN skew has an increasingly significant impact on signal quality and IO link error rate. For example, in PAM4 signaling, when the PN skew increases from a few picoseconds (ps) to more than 10 ps, the link error may increase by more than five orders of magnitude.

Controlling skew in the design and manufacturing process may prove difficult due to the aggregation of skew across the various components of the communication paths 104, and various approaches may result in impractical design rules, cost prohibitive design requirements, extra circuit area, or additional complexity to the physical design.

System 100 is operable to provide dynamic skew compensation by detecting an amount of skew between two signals of a received differential signal and adjusting the timing of one of the signals to reduce the skew between the two signals. The skew detection circuit 103 detects an amplitude of common mode noise in the common mode voltage that is indicative of the amount of skew between the signals of the differential signal received by the receiver 101. The skew compensation control circuit 122 of the skew detection circuit 103 then provides feedback based on the detected common mode noise to a skew compensation circuit 106 to delay one of the signals in order to reduce the skew in the differential signal.

In various embodiments, the receiver 101 can dynamically detect and compensate for the total PN skew (which has an amount that may not be known beforehand). Accordingly, the receiver 101 may recover a differential signal with improved signal quality and reduce the link error count, which may improve the throughput of high-speed IO links.

In some embodiments, the receiver 101 may leverage circuitry that may perform other functions (e.g., link training functions) in the serial link (e.g., sampler 118, phase interpolator 120, skew compensation control circuit 122, or portions of any of these) to provide skew compensation functionality, thus conserving valuable circuit area or power usage.

A differential signal received by receiver 101 may pass through skew compensation circuit 106. The skew compensation circuit 106 may be operable to delay either one of the signals of the differential signal. In some embodiments, when a signal is initially received, the delay for both signals may be set to zero or other initial value then may be adjusted once the skew has been detected by skew detection circuit 103.

The receiver 101 also includes a normal receiver path 105 comprising any suitable receiver circuitry to detect data transferred by the differential signal, such as a continuous time linear equalizer (CTLE) 110, a sampler/decision feedback equalizer (DFE) 112, a phase interpolator 114, or other suitable circuitry. A selection circuit 108 (e.g., a demultiplexer) is operable to pass the differential signal output by the skew compensation circuit 106 to either the skew detection circuit 103 or the normal receiver path 105. In operation, when a signal is initially received, the selection circuit 108 may pass the differential signal to the skew detection circuit 103 first (e.g., during or prior to a link training procedure) so that the skew can be compensated, after which the compensated differential signal will be passed by the selection circuit 108 to the normal receiver path 105 for detection of data transmitted by the signal (e.g., during normal communication over the link). In some embodiments, selection circuit 108 may comprise one or more fuses to permanently configure the selection circuit 108 to pass the output of the skew compensation circuit 106 to the normal receiver path 105 once a calibration procedure has been performed to detect the skew and configure the skew compensation circuit 106 to compensate for the skew (e.g., when the communication paths 104 are fixed and the skew does not change between communication sessions). In other embodiments, the selection circuit 108 may switch between the paths at any suitable time.

When the differential signal is passed to the skew detection circuit 103, the differential signal is coupled to common mode voltage (Vcom) generator 116. Vcom generator 116 outputs a common mode voltage of the differential signal (in various embodiments the common mode voltage may be a single ended signal or a differential signal).

The common mode voltage output is sampled by sampler 118 at various time points based on a clock signal (e.g., RX_clk) and a phase interpolator 120. The sampled results are provided to skew compensation control circuitry 122, which is in communication with skew compensation circuit 106 to control the delay that is applied to either the signal received over communication path 104A or the signal received over communication path 104B based on the sampled results.

In various embodiments, the skew detection circuit 103 may be duplicated for multiple pairs of communication paths (where only one pair of communication paths is shown in FIG. 1) that may be present between a transmitter and the receiver 101. In some embodiments, one or more components of the skew detection circuit 103 may be shared among multiple different pairs of communication paths (e.g., the skew detection circuit 103 or a portion thereof may be time shared among multiple pairs of communication paths).

FIGS. 4A-4B illustrate skew compensation circuits 402 and 404 in accordance with certain embodiments. Circuits 402 and 404 are each examples of circuits that may be used to implement skew compensation circuit 106. A skew compensation circuit may compensate the overall skew in the system, including the P and N mismatch from both platform and circuit sides. Circuit 402 of FIG. 4A receives a differential input signal comprising a first signal IN_P and a second signal IN_N. The differential signal passes through analog buffer 406. The analog buffer may provide signal isolation between the input and output nets as well as a peaking gain boost. In some embodiments, the analog buffer 406 may comprise a high frequency peaking network. In various embodiments, the analog buffer 406 comprises a passive peaking circuit to provide equalization with a peak at a high frequency in order to avoid injection of noise from active components (e.g., transistors), but in other embodiments, active components may be used.

Although the buffer 406 is shown as coupled to both Vdd and ground (GND), in other embodiments the buffer 406 may be coupled to only one of these (or to one or more different voltage references).

The output signals OUT_P and OUT_N of the analog buffer 406 are each coupled to a respective adjustable loading capacitor 408, where OUT_P is coupled to adjustable capacitor 408A and OUT_N is coupled to adjustable capacitor 408B. The capacitors 408A and 408B may be independently adjustable. The capacitors 408 may be used to control the skew compensation circuit's output loading to achieve different delay for the output signals OUT_P and OUT_N independently.

Circuit 404 of FIG. 4B is similar to circuit 402, but in circuit 404 the analog buffer 406 is implemented using a passive CTLE 412. Again, the output signals are each coupled to an adjustable capacitor 410A or 410B that may provide independent control of delay to be applied to either the signal output by OUT_P or the signal output by OUT_N.

FIG. 4C illustrates skew compensation that may be performed by skew compensation circuit 106 in accordance with certain embodiments. FIG. 4C depicts a first waveform 420 which is representative of a transition from a low voltage to a high voltage on one of the signals (e.g., Vp or Vn) of the differential signal that is an input to the skew compensation circuit 106. The waveform transitions from a low state to a high state (e.g., Vdd) that is above a threshold voltage that delineates a low logic level from a high logic level. The waveform 422 is representative of the same transition when the signal has been delayed by Δt by increasing the capacitance of the adjustable capacitor 408 (e.g., either 408A or 408B) coupled to the particular signal and may be one of the signals output by the skew compensation circuit 106. For example, if the waveform 420 depicts Vp, then the adjustable capacitor 408A is adjusted (e.g., the capacitance is increased) to delay Vp to yield waveform 422.

Conversely, if the waveform 420 depicts Vn, then the adjustable capacitor 408B is adjusted to delay Vn to yield waveform 422.

After the differential signal moves through the skew compensation circuit 106, it passes through the selection circuit 108. The selection circuit 108 may be used to select the regular SERDES IO mode (e.g., by routing the differential signal to the normal receiver path 105) or the PN skew compensation mode (e.g., by routing the differential signal to the skew detection circuit 103). When the PN skew compensation mode is selected, the Vcom generator 116, sampler 118, and skew compensation control circuit 122 may be enabled (whereas these circuits may be powered down when the differential signal is routed to the normal receiver path 105).

When the differential signal is routed to the skew detection circuit 103, the Vcom generator 116 first generates the common mode voltage Vcom of the received differential signal.

Figure 5A:
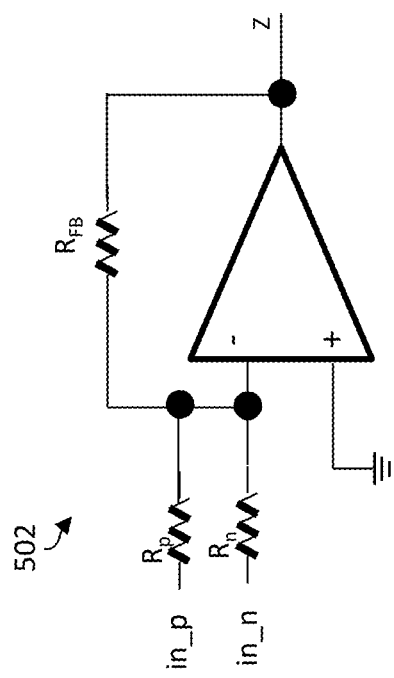
FIGS. 5A-5B illustrate common mode voltage detectors in accordance with certain embodiments.

FIG. 5A illustrates a common mode voltage generator 502 with a single ended output z which may be used to implement the Vcom generator 116. The generator 502 accepts a differential signal in_p and in_n as an input and outputs the common mode voltage (or a scaled version thereof) of the differential input signal as the output z. In some embodiments, the common mode voltage generator 502 may be implemented as a weighted summer circuit as shown.

The common mode voltage of the differential signal input is (in_p+in_n)/2. The transfer function of generator 502 is:

$$Z = \left( \frac{R_{FB}}{R_p} \times in_p + \frac{R_{FB}}{R_n} \times in_n \right)$$

If $R_p$, and $R_N$ have the same value ("R"), the transfer function becomes:

$$Z = \left( \frac{R_{FB}}{R} \times in\_p + \frac{R_{FB}}{R} \times in\_n \right) = \frac{R_{FB}}{R} \times (in\_p + in\_n)$$

Thus, in order to output the true common mode voltage, feedback resistor RFB may be ½ of the value of the $R_p$ and $R_n$ resistors. In other embodiments, a scaled version of the common mode voltage may be generated by the detector 502. For example, the values of the $R_p$ and $R_n$ resistors may be any suitable multiple of the feedback resistor RFB or vice versa. In some embodiments, scaling the common mode voltage output may provide for increased resolution for the sampler 118.

Figure 5B:
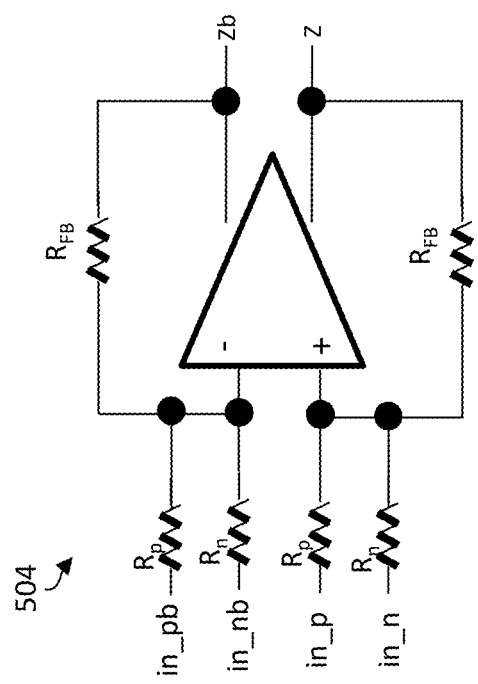

FIG. 5B illustrates a common mode voltage generator 504 with a differential output z and zb which may be used to implement the Vcom generator 116. The common mode voltage generator 504 accepts the differential signal in_p and in_n as well as complements of in_p (in_pb) and in_n (in_nb) as inputs. As in the circuit in FIG. 5A, the various resistances may have any suitable values in order to produce the desired common mode voltage or a scaled version thereof. In some embodiments, the $R_p$ and $R_n$ transistors may all have the same resistance and the two feedback transistors RFB have a common resistance value.

Returning again to FIG. 1, the common mode voltage output by Vcom generator 116 is provided to the sampler 118. The sampler 118 samples the common mode voltage (Vcom) at various time points and determines the amplitude of common mode noise based on the maximum and/or minimum sampled Vcom values. The skew compensation control circuit 122 uses this information to adjust a phase delay for one of the signals of the differential signal received by skew compensation circuit 106. The adjustment of the phase delay may be achieved, e.g., by adjustment of a capacitor (e.g., 408, 410) of the skew compensation circuit 106. In some embodiments, the amount that the capacitor is adjusted is based on the measured amplitude of the maximum and/or minimum value of the Vcom. In other embodiments, the capacitor may be adjusted by a predetermined amount regardless of the measured amplitude of the maximum and/or minimum value of the Vcom.

In order to obtain the amplitude of the Vcom max/min, the Vcom may be sampled at various points of a period of the RX_clk. These various points may be sampled by adjusting phase interpolator 120 to vary the phase of the clock (the "sampling clock") that is fed to the sampler 118. In some embodiments, the Vcom may be sampled at various points throughout two unit intervals of the RX_clk (e.g., when dual data rate clocking is used). The points may be evenly spaced in time or spaced otherwise.

The sampling process may begin by setting a reference voltage (Vref) of the sampler 118 and a phase of the sampling clock provided to sampler 118 to an initial value. The Vref may be compared against a sampled Vcom to determine which value is greater. Vref may be varied (e.g., incrementally raised) until the Vcom at the initial phase is found by the sampler 118 (e.g., through use of a comparator circuit or other suitable circuitry). An indication of the resulting Vcom may be made available to the skew compensation control circuit 122 or other logic tracking the sampled values.

The delay of the sampling clock is then adjusted (e.g., by changing a setting of the phase interpolator 120), and Vref is again swept until the Vcom at that sampling point is found. This process repeats until the Vcom at each sampling point has been sampled (or until a determination is made that the maximum and/or minimum Vcom has been found, e.g., based on the progression of Vcom values sampled).

Based on the sampled results, the skew compensation control circuit 122 is operable to determine the amplitude of the common mode noise, e.g., as indicated by the maximum and/or minimum Vcom voltage and control the skew compensation provided by skew compensation circuit 106 accordingly.

In some embodiments, skew compensation control circuit 122 may maintain a table of sampling points and Vref values with indications of whether the Vref value was greater or less than the sampled Vcom at the particular sampling point. The table may be used to identify the maximum Vcom voltage, minimum Vcom voltage, the timing of the maximum or minimum Vcom voltages, or other suitable information used by skew compensation control circuit 122 in order to direct adjustment of the skew. In other embodiments, such information may be tracked in any other suitable manner (e.g., by overwriting a maximum Vcom voltage when a new maximum Vcom voltage is encountered, etc.).

Some embodiments may involve determining a baseline Vcom as part of the skew detection process (although other embodiments do not require determination of the baseline Vcom). For example, in order to determine the baseline Vcom, DC signals may be applied to the P and N signals (e.g., the highest signal voltage such as Vdd to the P signal and the lowest signal voltage such as GND to the N signal) and the voltage at the output of the Vcom generator 116 may be determined to be the baseline Vcom. The sampled Vcom values may then be considered relative to the baseline Vcom value (e.g., to determine what the largest deviation from the baseline Vcom is in order to decide how to compensate for the corresponding skew).

In some embodiments, the skew compensation control circuit 122 may utilize a lookup table to determine which signal to delay and how much to delay that signal (e.g., via a change in capacitance of skew compensation circuit 106). Such a lookup may accept any suitable parameters as inputs, such as an amount of common mode noise, a maximum Vcom, a minimum Vcom, whether the maximum Vcom comes before or after the minimum Vcom relative to a reference point such as an edge of one of the signals (as this may indicate which signal is to be delayed), or other suitable information (such as any of that described herein). In one embodiment, the lookup table may output an indication of which capacitor (e.g., 408, 410) of the skew compensation circuit 106 is to be adjusted. In another embodiment, the lookup table may output an indication of which capacitor as well as a new capacitance setting for the capacitor.

Figure 6:
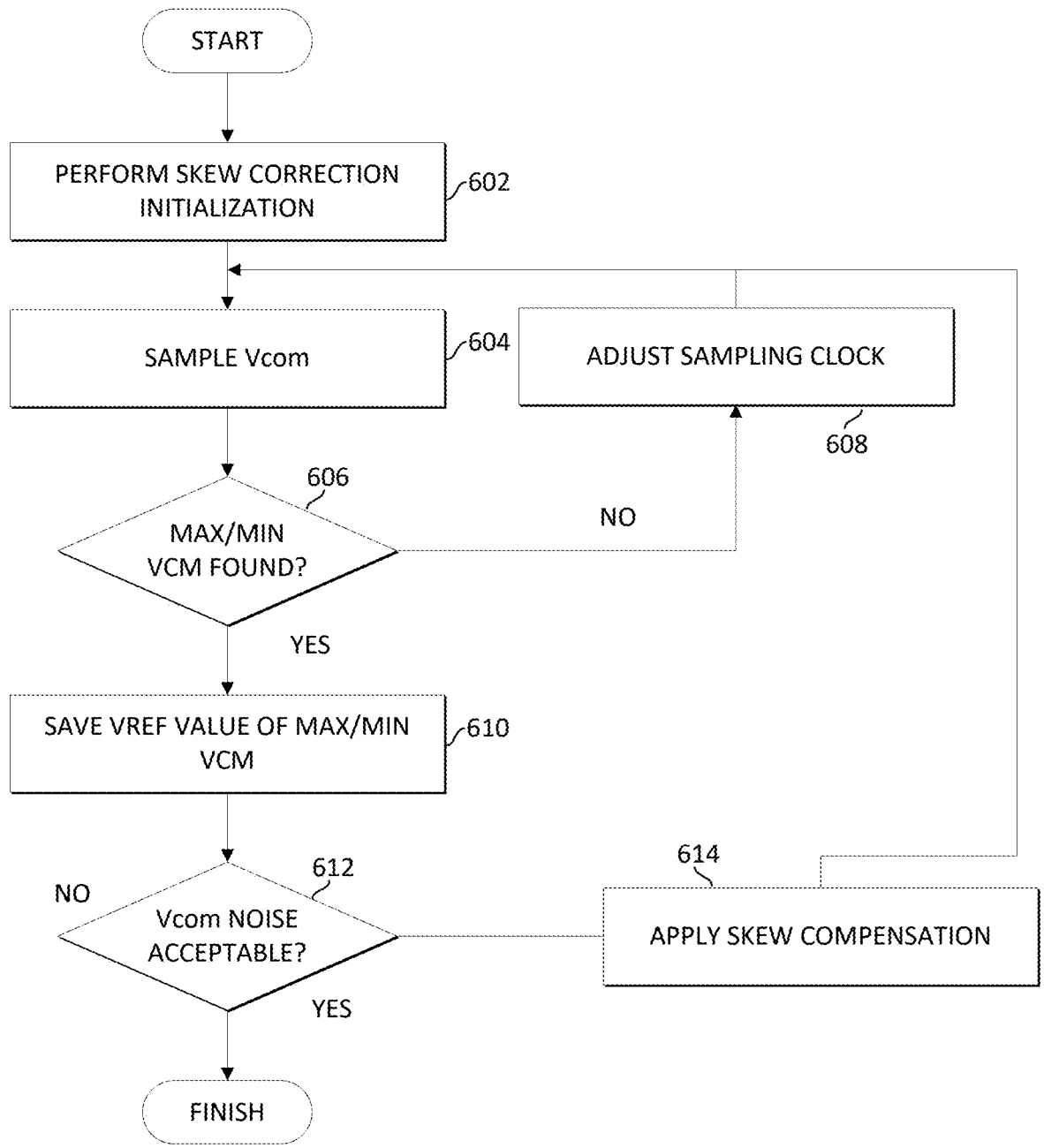
FIG. 6 illustrates a flow for skew detection and compensation in accordance with certain embodiments.

FIG. 6 illustrates a flow 600 for skew detection and compensation in accordance with certain embodiments. At 602, skew correction initialization is performed. This may include setting the skew compensation to zero (e.g., no skew compensation is provided by skew compensation circuit 106) such that the signal output by the skew compensation circuit 106 has the same skew as the signal received by the skew compensation circuit 106. This operation may be performed in any suitable manner, such as through a reset signal, through adjustment of one or more of the capacitors of the skew compensation circuit 106 (e.g., by skew compensation control circuit 122), or other suitable manner.

The initialization may also include configuring the selection circuit 108 to pass the differential signal from the skew compensation circuit 106 to the skew detection circuit 103. In some embodiments, the initialization may also include initializing the sampling clock of sampler 118.

At 604, Vcom is sampled at the current sampling clock setting. At 606, a determination is made as to whether the maximum and minimum Vcom have been found. Assuming that on the first iteration the maximum and minimum Vcom have not been found, the flow will loop to 608 where the sampling clock is adjusted and the Vcom is sampled again.

Once the maximum and minimum Vcom have been found, the flow moves to 610 where an indication of the Vref values of the sampler at the maximum Vcom voltage and minimum Vcom voltage are saved.

At 612 a determination of whether the common mode noise (e.g., as indicated by the saved Vref values) is acceptable. For example, if the values indicate that the common mode noise is zero (or under a particular threshold), then no skew adjustment is needed and the flow may end. If the common mode noise is not acceptable, then the flow moves to 614.

In various embodiments, the determination of whether the common mode noise is acceptable may be made in any suitable manner. For example, if all sampling points indicate the same sampled Vcom voltage, then the common mode noise is acceptable. As another example, if the difference between the lowest sampled Vcom voltage and the highest sampled Vcom voltage is below a predetermined threshold, the common mode noise may be found to be acceptable. As another example, if the difference between the baseline Vcom voltage and the lowest and/or highest sampled Vcom voltage is below a predetermined threshold, the common mode noise may be found to be acceptable.

At 614, skew correction is applied. This may include communication between the skew compensation control circuit 122 and the skew compensation circuit 106. In a particular embodiment, the skew compensation control circuit 122 may direct the skew compensation circuit 106 to adjust a delay of one of the input signals by a particular amount. For example, the skew compensation control circuit 122 may specify one of the adjustable capacitors of the skew compensation circuit 106 and a new capacitance value for the capacitor (or an amount of change in capacitance for the capacitor). In some embodiments, the magnitude of the new value for the capacitor is based on the magnitude of the common mode noise (e.g., as indicated by the minimum and maximum Vcom detected). In another embodiment, the amount of adjustment may be independent of the magnitude of the common mode noise (e.g., a constant adjustment may be made in each iteration of 614). The flow then returns to 604 where the sampling is repeated to determine if the skew adjustment has resulted in an acceptable common mode voltage waveform.

In some embodiments, the flow may continue to be repeated as long as the skew is being decreased (e.g., as long as the maximum Vcom is being decreased or the minimum Vcom is being raised), whereas the flow may end if the skew is unable to be further decreased.

Numerous specific details are set forth herein, such as examples of specific types of processors and system configurations, specific hardware structures, and specific architectural and micro architectural details in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present disclosure.

Any portion of the systems or components described herein may be included within a device capable of transmitting and/or receiving data. For example, any portion of system 100 may be included in a computing device, such as a host device or a peripheral device, either of which may include a processor, system-on-a-chip (SoC), or other suitable circuitry. A host device may comprise any suitable computing system operable to connect to peripheral devices and transmit data to and/or receive data from peripheral devices. A host device may comprise one or more processors and one or more ports. A host device may comprise or be coupled to any other suitable circuitry, such as memory, interconnect, one or more communication controllers, or other suitable circuitry. Peripheral devices may include any suitable device to communicate with a host device. For example, a peripheral device may be an input device such as a an image scanner, a video recorder, a microphone, a data acquisition device, or other suitable device that generally communicates data to the host device; an output device such as a monitor, projector, printer, or other suitable device that generally receives data from the host device; or a device such as a communication hub, hard disk drive, flash drive, memory card, or other suitable device to both send and receive data from the host device.

Although the embodiments herein may be described with reference to specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from the features described herein. For example, the disclosed embodiments are not limited to particular host devices or peripheral devices, but may apply to any suitable host or peripheral devices such as desktop computer systems, server computer systems, handheld devices, tablets, other thin notebooks, systems on a chip (SoC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatuses, methods, and systems described herein are not limited to physical computing devices, but may also relate to software optimizations.

Figure 7:
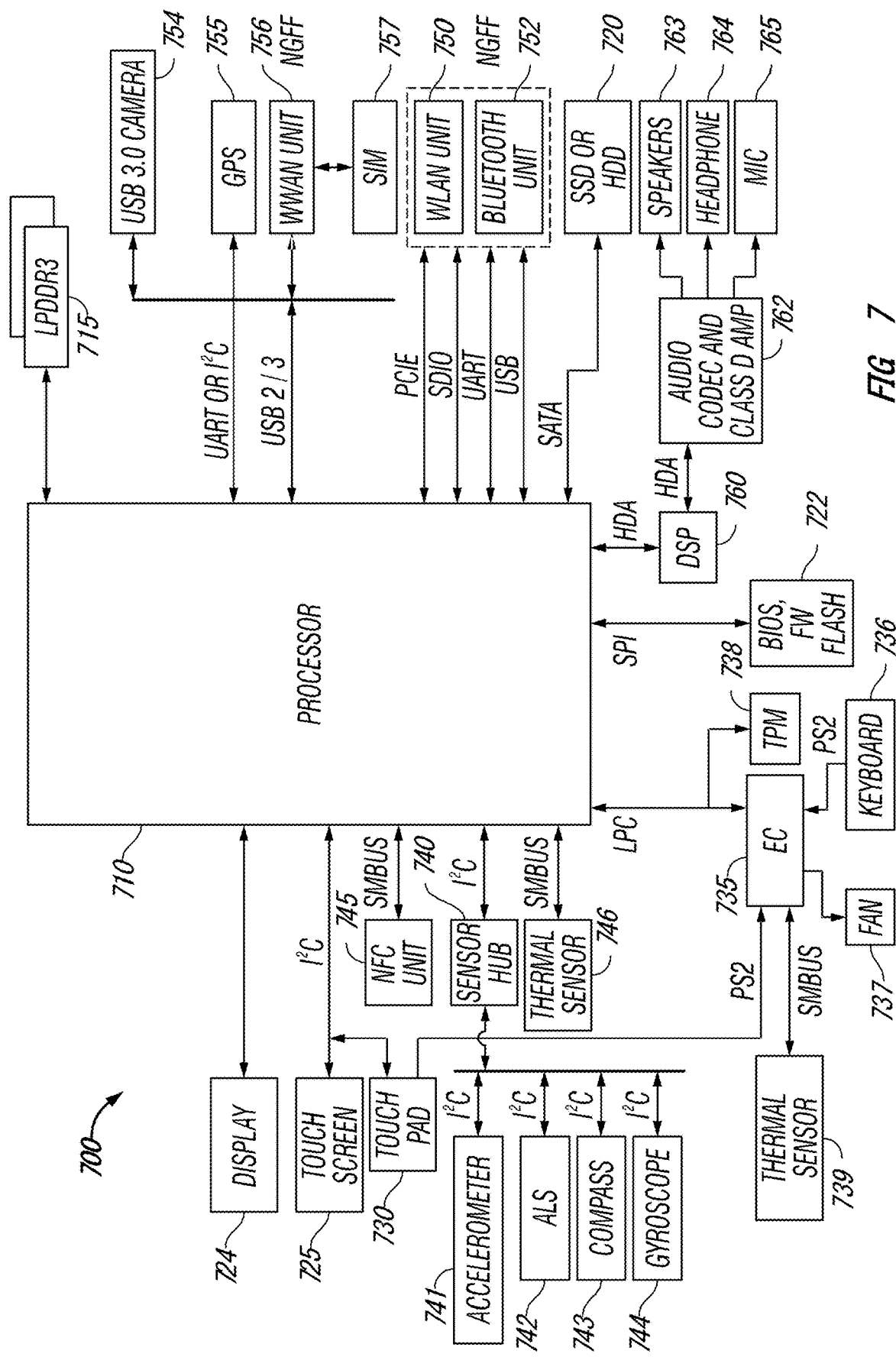
FIG. 7 illustrates a block diagram of components present in a computer system in accordance with certain embodiments.
Figure 8:
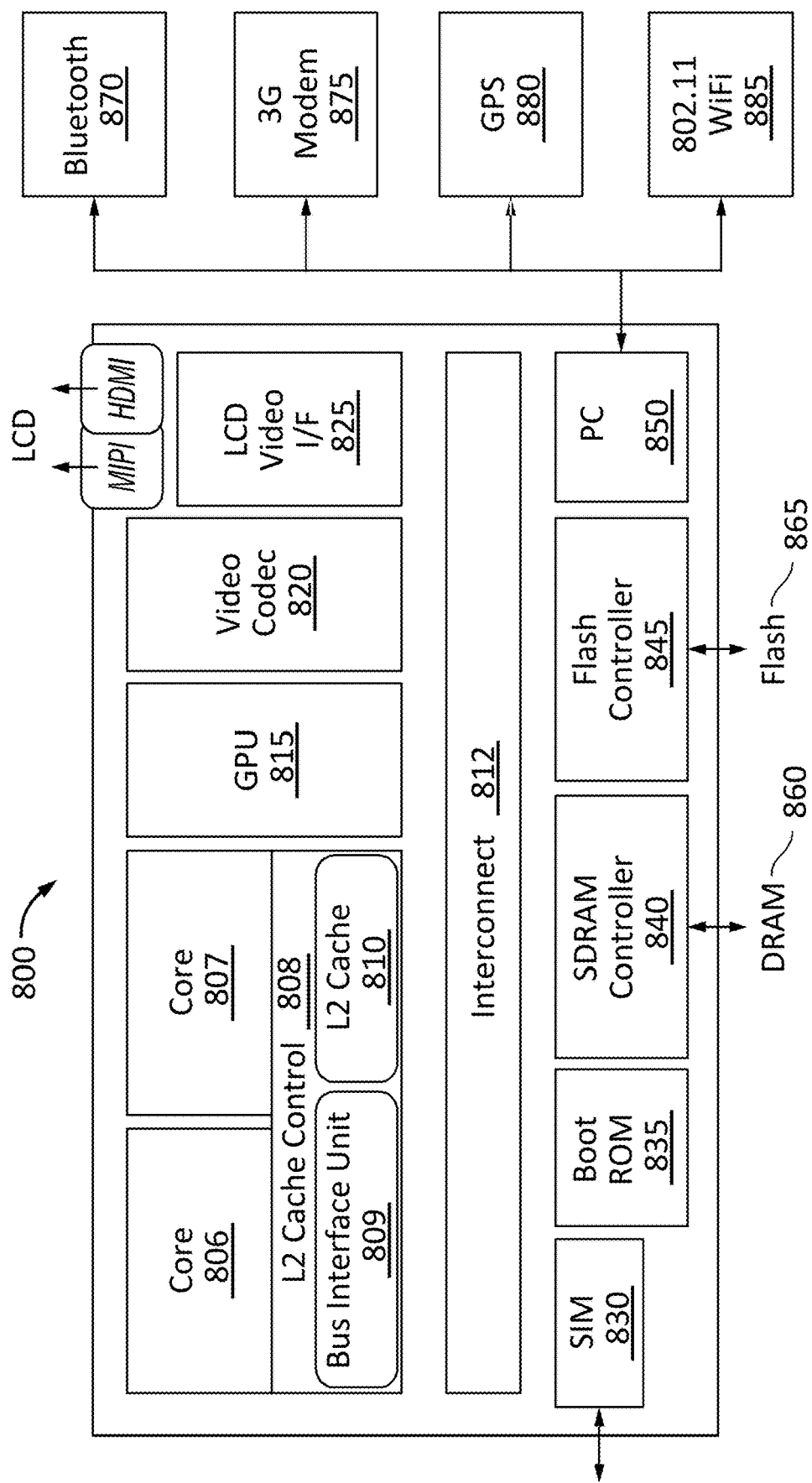
FIG. 8 illustrates another block diagram for an example computing system in accordance with certain embodiments.

FIGS. 7 and 8 depict example systems in which various embodiments described herein may be implemented. For example, any of the components depicted could implement receiver 101 and/or transmitter 102.

Referring now to FIG. 7, a block diagram of components present in a computer system that may function as either a host device or a peripheral device (or which may include both a host device and one or more peripheral devices) in accordance with certain embodiments is described. As shown in FIG. 7, system 700 includes any combination of components. These components may be implemented as ICs, portions thereof, discrete electronic devices, or other modules, logic, hardware, software, firmware, or a combination thereof adapted in a computer system, or as components otherwise incorporated within a chassis of the computer system. Note also that the block diagram of FIG. 7 is intended to show a high level view of many components of the computer system. However, it is to be understood that some of the components shown may be omitted, additional components may be present, and different arrangement of the components shown may occur in other implementations. As a result, the disclosure described above may be implemented in any portion of one or more of the interconnects illustrated or described below.

As seen in FIG. 7, a processor 710, in one embodiment, includes a microprocessor, multi-core processor, multi-threaded processor, an ultra low voltage processor, an embedded processor, or other known processing element. In the illustrated implementation, processor 710 acts as a main processing unit and central hub for communication with many of the various components of the system 700. As one example, processor 710 is implemented as a system on a chip (SoC). As a specific illustrative example, processor 710 includes an Intel® Architecture Core™-based processor such as an i3, i5, i7 or another such processor available from Intel Corporation, Santa Clara, CA. However, other low power processors such as those available from Advanced Micro Devices, Inc. (AMD) of Sunnyvale, CA, a MIPS-based design from MIPS Technologies, Inc. of Sunnyvale, CA, an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor. Note that many of the customer versions of such processors are modified and varied; however, they may support or recognize a specific instructions set that performs defined algorithms as set forth by the processor licensor. Here, the microarchitecture implementation may vary, but the architectural function of the processor is usually consistent. Certain details regarding the architecture and operation of processor 710 in one implementation will be discussed further below to provide an illustrative example.

Processor 710, in one embodiment, communicates with a system memory 715. As an illustrative example, which in an embodiment can be implemented via multiple memory devices to provide for a given amount of system memory. As examples, the memory can be in accordance with a Joint Electron Devices Engineering Council (JEDEC) low power double data rate (LPDDR)-based design such as the current LPDDR2 standard according to JEDEC JESD 209-2E (published April 2009), or a next generation LPDDR standard to be referred to as LPDDR3 or LPDDR4 that will offer extensions to LPDDR2 to increase bandwidth. In various implementations the individual memory devices may be of different package types such as single die package (SDP), dual die package (DDP) or quad die package (Q17P). These devices, in some embodiments, are directly soldered onto a motherboard to provide a lower profile solution, while in other embodiments the devices are configured as one or more memory modules that in turn couple to the motherboard by a given connector. And of course, other memory implementations are possible such as other types of memory modules, e.g., dual inline memory modules (DIMMs) of different varieties including but not limited to microDIMMs, MiniDIMMs. In a particular illustrative embodiment, memory is sized between 2 GB and 16 GB, and may be configured as a DDR3LM package or an LPDDR2 or LPDDR3 memory that is soldered onto a motherboard via a ball grid array (BGA).

To provide for persistent storage of information such as data, applications, one or more operating systems and so forth, a mass storage 720 may also couple to processor 710. In various embodiments, to enable a thinner and lighter system design as well as to improve system responsiveness, this mass storage may be implemented via a SSD. However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 7, a flash device 722 may be coupled to processor 710, e.g., via a serial peripheral interface (SPI). This flash device may provide for non-volatile storage of system software, including a basic input/output software (BIOS) as well as other firmware of the system.

In various embodiments, mass storage of the system is implemented by a SSD alone or as a disk, optical or other drive with an SSD cache. In some embodiments, the mass storage is implemented as a SSD or as a HDD along with a restore (RST) cache module. In various implementations, the HDD provides for storage of between 320 GB-4 terabytes (TB) and upward while the RST cache is implemented with a SSD having a capacity of 24 GB-256 GB. Note that such SSD cache may be configured as a single level cache (SLC) or multi-level cache (MLC) option to provide an appropriate level of responsiveness. In a SSD-only option, the module may be accommodated in various locations such as in a mSATA or NGFF slot. As an example, an SSD has a capacity ranging from 120 GB-1 TB.

Various input/output (IO) devices may be present within system 700. Specifically shown in the embodiment of FIG.

7 is a display 724 which may be a high definition LCD or LED panel configured within a lid portion of the chassis. This display panel may also provide for a touch screen 725, e.g., adapted externally over the display panel such that via a user's interaction with this touch screen, user inputs can be provided to the system to enable desired operations, e.g., with regard to the display of information, accessing of information and so forth. In one embodiment, display 724 may be coupled to processor 710 via a display interconnect that can be implemented as a high performance graphics interconnect. Touch screen 725 may be coupled to processor 710 via another interconnect, which in an embodiment can be an I2C interconnect. As further shown in FIG. 7, in addition to touch screen 725, user input by way of touch can also occur via a touch pad 730 which may be configured within the chassis and may also be coupled to the same I2C interconnect as touch screen 725.

The display panel may operate in multiple modes. In a first mode, the display panel can be arranged in a transparent state in which the display panel is transparent to visible light. In various embodiments, the majority of the display panel may be a display except for a bezel around the periphery. When the system is operated in a notebook mode and the display panel is operated in a transparent state, a user may view information that is presented on the display panel while also being able to view objects behind the display. In addition, information displayed on the display panel may be viewed by a user positioned behind the display. Or the operating state of the display panel can be an opaque state in which visible light does not transmit through the display panel.

In a tablet mode the system is folded shut such that the back display surface of the display panel comes to rest in a position such that it faces outwardly towards a user, when the bottom surface of the base panel is rested on a surface or held by the user. In the tablet mode of operation, the back display surface performs the role of a display and user interface, as this surface may have touch screen functionality and may perform other known functions of a conventional touch screen device, such as a tablet device. To this end, the display panel may include a transparency-adjusting layer that is disposed between a touch screen layer and a front display surface. In some embodiments the transparency-adjusting layer may be an electrochromic layer (EC), a LCD layer, or a combination of EC and LCD layers.

In various embodiments, the display can be of different sizes, e.g., an 11.6" or a 13.3" screen, and may have a 16:9 aspect ratio, and at least 300 nits brightness. Also the display may be of full high definition (HD) resolution (at least 1920×1080p), be compatible with an embedded display port (eDP), and be a low power panel with panel self refresh.

As to touch screen capabilities, the system may provide for a display multi-touch panel that is multi-touch capacitive and being at least 5 finger capable. And in some embodiments, the display may be 10 finger capable. In one embodiment, the touch screen is accommodated within a damage and scratch-resistant glass and coating (e.g., Gorilla Glass™ or Gorilla Glass 2™) for low friction to reduce "finger burn" and avoid "finger skipping". To provide for an enhanced touch experience and responsiveness, the touch panel, in some implementations, has multi-touch functionality, such as less than 2 frames (30 Hz) per static view during pinch zoom, and single-touch functionality of less than 1 cm per frame (30 Hz) with 200 ms (lag on finger to pointer). The display, in some implementations, supports edge-to-edge glass with a minimal screen bezel that is also flush with the panel surface, and limited IO interference when using multi-touch.

For perceptual computing and other purposes, various sensors may be present within the system and may be coupled to processor 710 in different manners. Certain inertial and environmental sensors may couple to processor 710 through a sensor hub 740, e.g., via an I2C interconnect. In the embodiment shown in FIG. 7, these sensors may include an accelerometer 741, an ambient light sensor (ALS) 742, a compass 743 and a gyroscope 744. Other environmental sensors may include one or more thermal sensors 746 which in some embodiments couple to processor 710 via a system management bus (SMBus) bus.

Using the various inertial and environmental sensors present in a platform, many different use cases may be realized. These use cases enable advanced computing operations including perceptual computing and also allow for enhancements with regard to power management/battery life, security, and system responsiveness.

For example with regard to power management/battery life issues, based at least on part on information from an ambient light sensor, the ambient light conditions in a location of the platform are determined and intensity of the display controlled accordingly. Thus, power consumed in operating the display is reduced in certain light conditions.

As to security operations, based on context information obtained from the sensors such as location information, it may be determined whether a user is allowed to access certain secure documents. For example, a user may be permitted to access such documents at a work place or a home location. However, the user is prevented from accessing such documents when the platform is present at a public location. This determination, in one embodiment, is based on location information, e.g., determined via a GPS sensor or camera recognition of landmarks. Other security operations may include providing for pairing of devices within a close range of each other, e.g., a portable platform as described herein and a user's desktop computer, mobile telephone or so forth. Certain sharing, in some implementations, are realized via near field communication when these devices are so paired. However, when the devices exceed a certain range, such sharing may be disabled. Furthermore, when pairing a platform as described herein and a smartphone, an alarm may be configured to be triggered when the devices move more than a predetermined distance from each other, when in a public location. In contrast, when these paired devices are in a safe location, e.g., a work place or home location, the devices may exceed this predetermined limit without triggering such alarm.

Responsiveness may also be enhanced using the sensor information. For example, even when a platform is in a low power state, the sensors may still be enabled to run at a relatively low frequency. Accordingly, any changes in a location of the platform, e.g., as determined by inertial sensors, GPS sensor, or so forth is determined. If no such changes have been registered, a faster connection to a previous wireless hub such as a Wi-Fi™ access point or similar wireless enabler occurs, as there is no need to scan for available wireless network resources in this case. Thus, a greater level of responsiveness when waking from a low power state is achieved.

It is to be understood that many other use cases may be enabled using sensor information obtained via the integrated sensors within a platform as described herein, and the above examples are only for purposes of illustration. Using a system as described herein, a perceptual computing system may allow for the addition of alternative input modalities, including gesture recognition, and enable the system to sense user operations and intent.

In some embodiments one or more infrared or other heat sensing elements, or any other element for sensing the presence or movement of a user may be present. Such sensing elements may include multiple different elements working together, working in sequence, or both. For example, sensing elements include elements that provide initial sensing, such as light or sound projection, followed by sensing for gesture detection by, for example, an ultrasonic time of flight camera or a patterned light camera.

Also in some embodiments, the system includes a light generator to produce an illuminated line. In some embodiments, this line provides a visual cue regarding a virtual boundary, namely an imaginary or virtual location in space, where action of the user to pass or break through the virtual boundary or plane is interpreted as an intent to engage with the computing system. In some embodiments, the illuminated line may change colors as the computing system transitions into different states with regard to the user. The illuminated line may be used to provide a visual cue for the user of a virtual boundary in space, and may be used by the system to determine transitions in state of the computer with regard to the user, including determining when the user wishes to engage with the computer.

In some embodiments, the computer senses user position and operates to interpret the movement of a hand of the user through the virtual boundary as a gesture indicating an intention of the user to engage with the computer. In some embodiments, upon the user passing through the virtual line or plane the light generated by the light generator may change, thereby providing visual feedback to the user that the user has entered an area for providing gestures to provide input to the computer.

Display screens may provide visual indications of transitions of state of the computing system with regard to a user. In some embodiments, a first screen is provided in a first state in which the presence of a user is sensed by the system, such as through use of one or more of the sensing elements.

In some implementations, the system acts to sense user identity, such as by facial recognition. Here, transition to a second screen may be provided in a second state, in which the computing system has recognized the user identity, where this second the screen provides visual feedback to the user that the user has transitioned into a new state. Transition to a third screen may occur in a third state in which the user has confirmed recognition of the user.

In some embodiments, the computing system may use a transition mechanism to determine a location of a virtual boundary for a user, where the location of the virtual boundary may vary with user and context. The computing system may generate a light, such as an illuminated line, to indicate the virtual boundary for engaging with the system. In some embodiments, the computing system may be in a waiting state, and the light may be produced in a first color. The computing system may detect whether the user has reached past the virtual boundary, such as by sensing the presence and movement of the user using sensing elements.

In some embodiments, if the user has been detected as having crossed the virtual boundary (such as the hands of the user being closer to the computing system than the virtual boundary line), the computing system may transition to a state for receiving gesture inputs from the user, where a mechanism to indicate the transition may include the light indicating the virtual boundary changing to a second color.

In some embodiments, the computing system may then determine whether gesture movement is detected. If gesture movement is detected, the computing system may proceed with a gesture recognition process, which may include the use of data from a gesture data library, which may reside in memory in the computing device or may be otherwise accessed by the computing device.

If a gesture of the user is recognized, the computing system may perform a function in response to the input, and return to receive additional gestures if the user is within the virtual boundary. In some embodiments, if the gesture is not recognized, the computing system may transition into an error state, where a mechanism to indicate the error state may include the light indicating the virtual boundary changing to a third color, with the system returning to receive additional gestures if the user is within the virtual boundary for engaging with the computing system.

As mentioned above, in other embodiments the system can be configured as a convertible tablet system that can be used in at least two different modes, a tablet mode and a notebook mode. The convertible system may have two panels, namely a display panel and a base panel such that in the tablet mode the two panels are disposed in a stack on top of one another. In the tablet mode, the display panel faces outwardly and may provide touch screen functionality as found in conventional tablets. In the notebook mode, the two panels may be arranged in an open clamshell configuration.

In various embodiments, the accelerometer may be a 3-axis accelerometer having data rates of at least 50 Hz. A gyroscope may also be included, which can be a 3-axis gyroscope. In addition, an e-compass/magnetometer may be present. Also, one or more proximity sensors may be provided (e.g., for lid open to sense when a person is in proximity (or not) to the system and adjust power/performance to extend battery life). For some OS's Sensor Fusion capability including the accelerometer, gyroscope, and compass may provide enhanced features. In addition, via a sensor hub having a real-time clock (RTC), a wake from sensors mechanism may be realized to receive sensor input when a remainder of the system is in a low power state.

In some embodiments, an internal lid/display open switch or sensor to indicate when the lid is closed/open, and can be used to place the system into Connected Standby or automatically wake from Connected Standby state. Other system sensors can include ACPI sensors for internal processor, memory, and skin temperature monitoring to enable changes to processor and system operating states based on sensed parameters.

Also seen in FIG. 7, various peripheral devices may couple to processor 710. In the embodiment shown, various components can be coupled through an embedded controller 735. Such components can include a keyboard 736 (e.g., coupled via a PS2 interface), a fan 737, and a thermal sensor 739. In some embodiments, touch pad 730 may also couple to EC 735 via a PS2 interface. In addition, a security processor such as a trusted platform module (TPM) 738 in accordance with the Trusted Computing Group (TCG) TPM Specification Version 1.2, dated Oct. 2, 2003, may also couple to processor 710 via this LPC interconnect. However, understand the scope of the present disclosure is not limited in this regard and secure processing and storage of secure information may be in another protected location such as a static random access memory (SRAM) in a security coprocessor, or as encrypted data blobs that are only decrypted when protected by a secure enclave (SE) processor mode.

In a particular implementation, peripheral ports may include a high definition media interface (HDMI) connector (which can be of different form factors such as full size, mini or micro); one or more USB ports, such as full-size external ports in accordance with the Universal Serial Bus (USB) Revision 3.2 Specification (September 2017), with at least one powered for charging of USB devices (such as smartphones) when the system is in Connected Standby state and is plugged into AC wall power. In addition, one or more Thunderbolt™ ports can be provided. Other ports may include an externally accessible card reader such as a full size SD-XC card reader and/or a SIM card reader for WWAN (e.g., an 8 pin card reader). For audio, a 3.5 mm jack with stereo sound and microphone capability (e.g., combination functionality) can be present, with support for jack detection (e.g., headphone only support using microphone in the lid or headphone with microphone in cable). In some embodiments, this jack can be re-taskable between stereo headphone and stereo microphone input. Also, a power jack can be provided for coupling to an AC brick.

System 700 can communicate with external devices in a variety of manners, including wirelessly. In the embodiment shown in FIG. 7, various wireless modules, each of which can correspond to a radio configured for a particular wireless communication protocol, are present. One manner for wireless communication in a short range such as a near field may be via a near field communication (NFC) unit 745 which may communicate, in one embodiment with processor 710 via an SMBus. Note that via this NFC unit 745, devices in close proximity to each other can communicate. For example, a user can enable system 700 to communicate with another (e.g.,) portable device such as a smartphone of the user via adapting the two devices together in close relation and enabling transfer of information such as identification information payment information, data such as image data or so forth. Wireless power transfer may also be performed using a NFC system.

Using the NFC unit described herein, users can bump devices side-to-side and place devices side-by-side for near field coupling functions (such as near field communication and wireless power transfer (WPT)) by leveraging the coupling between coils of one or more of such devices. More specifically, embodiments provide devices with strategically shaped, and placed, ferrite materials, to provide for better coupling of the coils. Each coil has an inductance associated with it, which can be chosen in conjunction with the resistive, capacitive, and other features of the system to enable a common resonant frequency for the system.

As further seen in FIG. 7, additional wireless units can include other short range wireless engines including a WLAN unit 750 and a Bluetooth unit 752. Using WLAN unit 750, Wi-Fi™ communications in accordance with a given Institute of Electrical and Electronics Engineers (IEEE) 802.11 standard can be realized, while via Bluetooth unit 752, short range communications via a Bluetooth protocol can occur. These units may communicate with processor 710 via, e.g., a USB link or a universal asynchronous receiver transmitter (UART) link. Or these units may couple to processor 710 via an interconnect according to a Peripheral Component Interconnect Express™ (PCIe™) protocol, e.g., in accordance with the PCI Express™ Specification Base Specification version 3.0 (published Jan. 17, 2007), or another such protocol such as a serial data input/output (SDIO) standard. Of course, the actual physical connection between these peripheral devices, which may be configured on one or more add-in cards, can be by way of the NGFF connectors adapted to a motherboard.

In addition, wireless wide area communications, e.g., according to a cellular or other wireless wide area protocol, can occur via a WWAN unit 756 which in turn may couple to a subscriber identity module (SIM) 757. In addition, to enable receipt and use of location information, a GPS module 755 may also be present. Note that in the embodiment shown in FIG. 7, WWAN unit 756 and an integrated capture device such as a camera module 754 may communicate via a given USB protocol such as a USB 2.0 or 3.0 link, or a UART or I2C protocol. Again, the actual physical connection of these units can be via adaptation of a NGFF add-in card to an NGFF connector configured on the motherboard.

In a particular embodiment, wireless functionality can be provided modularly, e.g., with a WiFi™ 802.11ac solution (e.g., add-in card that is backward compatible with IEEE 802.11abgn) with support for Windows 8 CS. This card can be configured in an internal slot (e.g., via an NGFF adapter). An additional module may provide for Bluetooth capability (e.g., Bluetooth 4.0 with backwards compatibility) as well as Intel® Wireless Display functionality. In addition NFC support may be provided via a separate device or multifunction device, and can be positioned as an example, in a front right portion of the chassis for easy access. A still additional module may be a WWAN device that can provide support for 3G/4G/LTE and GPS. This module can be implemented in an internal (e.g., NGFF) slot. Integrated antenna support can be provided for WiFi™, Bluetooth, WWAN, NFC and GPS, enabling seamless transition from WiFi™ to WWAN radios, wireless gigabit (WiGig) in accordance with the Wireless Gigabit Specification (July 2010), and vice versa.

As described above, an integrated camera can be incorporated in the lid. As one example, this camera can be a high resolution camera, e.g., having a resolution of at least 2.0 megapixels (MP) and extending to 6.0 MP and beyond.

To provide for audio inputs and outputs, an audio processor can be implemented via a digital signal processor (DSP) 760, which may couple to processor 710 via a high definition audio (HDA) link. Similarly, DSP 760 may communicate with an integrated coder/decoder (CODEC) and amplifier 762 that in turn may couple to output speakers 763 which may be implemented within the chassis. Similarly, amplifier and CODEC 762 can be coupled to receive audio inputs from a microphone 765 which in an embodiment can be implemented via dual array microphones (such as a digital microphone array) to provide for high quality audio inputs to enable voice-activated control of various operations within the system. Note also that audio outputs can be provided from amplifier/CODEC 762 to a headphone jack 764. Although shown with these particular components in the embodiment of FIG. 7, understand the scope of the present disclosure is not limited in this regard.

In a particular embodiment, the digital audio codec and amplifier are capable of driving the stereo headphone jack, stereo microphone jack, an internal microphone array and stereo speakers. In different implementations, the codec can be integrated into an audio DSP or coupled via an HD audio path to a peripheral controller hub (PCH). In some implementations, in addition to integrated stereo speakers, one or more bass speakers can be provided, and the speaker solution can support DTS audio.

In some embodiments, processor 710 may be powered by an external voltage regulator (VR) and multiple internal voltage regulators that are integrated inside the processor die, referred to as fully integrated voltage regulators (FIVRs). The use of multiple FIVRs in the processor enables the grouping of components into separate power planes, such that power is regulated and supplied by the FIVR to only those components in the group. During power management, a given power plane of one FIVR may be powered down or off when the processor is placed into a certain low power state, while another power plane of another FIVR remains active, or fully powered.

Power control in the processor can lead to enhanced power savings. For example, power can be dynamically allocated between cores, individual cores can change frequency/voltage, and multiple deep low power states can be provided to enable very low power consumption. In addition, dynamic control of the cores or independent core portions can provide for reduced power consumption by powering off components when they are not being used.

In different implementations, a security module such as a TPM can be integrated into a processor or can be a discrete device such as a TPM 2.0 device. With an integrated security module, also referred to as Platform Trust Technology (PTT), BIOS/firmware can be enabled to expose certain hardware features for certain security features, including secure instructions, secure boot, Intel® Anti-Theft Technology, Intel® Identity Protection Technology, Intel® Trusted Execution Technology (TxT), and Intel® Manageability Engine Technology along with secure user interfaces such as a secure keyboard and display.

Turning next to FIG. 8, another block diagram for an example computing system that may serve as a host device or peripheral device (or may include both a host device and one or more peripheral devices) in accordance with certain embodiments is shown. As a specific illustrative example, SoC 800 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SoC 800 includes 2 cores-806 and 807. Similar to the discussion above, cores 806 and 807 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 806 and 807 are coupled to cache control 808 that is associated with bus interface unit 809 and L2 cache 810 to communicate with other parts of system 800. Interconnect 812 includes an on-chip interconnect, such as an IOSF, AMBA, or other interconnect discussed above, which potentially implements one or more aspects of the described disclosure.

Interconnect 812 provides communication channels to the other components, such as a Subscriber Identity Module (SIM) 830 to interface with a SIM card, a boot rom 835 to hold boot code for execution by cores 806 and 807 to initialize and boot SoC 800, a SDRAM controller 840 to interface with external memory (e.g. DRAM 860), a flash controller 845 to interface with non-volatile memory (e.g. Flash 865), a peripheral control 850 (e.g. Serial Peripheral Interface) to interface with peripherals, video codecs 820 and Video interface 825 to display and receive input (e.g. touch enabled input), GPU 815 to perform graphics related computations, etc. Any of these interfaces may incorporate aspects of the disclosure described herein.

In addition, the system illustrates peripherals for communication, such as a Bluetooth module 870, 3G modem 875, GPS 880, and WiFi 885. Note as stated above, a UE includes a radio for communication. As a result, these peripheral communication modules are not all required. However, in a UE some form of a radio for external communication is to be included.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any non-transitory mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; or other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Example 1 includes an apparatus comprising a skew detection circuit to sample a common mode voltage of a differential signal, wherein the sampled common mode voltage is indicative of an amount of skew between a first signal of the differential signal and a second signal of the differential signal; and a skew compensation circuit to adjust a delay of the first signal or the second signal based on the sampled common mode voltage to reduce the amount of skew.

Example 2 includes the subject matter of Example 1, and wherein the skew compensation circuit comprises a first adjustable capacitor to couple to the first signal and a second adjustable capacitor to couple to the second signal.

Example 3 includes the subject matter of any of Examples 1 and 2, and wherein the skew compensation circuit is to adjust the first or second adjustable capacitor to reduce the amount of skew based on the sampled common mode voltage.

Example 4 includes the subject matter of any of Examples 1-3, and wherein the skew compensation circuit further comprises an analog buffer.

Example 5 includes the subject matter of any of Examples 1-4, and wherein the analog buffer comprises a passive continuous time linear equalizer.

Example 6 includes the subject matter of any of Examples 1-5, and further including a selection circuit to selectively couple an output of the skew compensation circuit to the skew detection circuit or to a receiver path to detect data transmitted by the differential signal.

Example 7 includes the subject matter of any of Examples 1-6, and wherein the skew detection circuit comprises a common mode voltage measurement circuit comprising a feedback resistor, a first resistor coupled to the first signal, and a second resistor coupled to the second signal.

Example 8 includes the subject matter of any of Examples 1-7, and wherein the first and second resistor each have the same resistance value.

Example 9 includes the subject matter of any of Examples 1-8, and wherein the skew detection circuit is to determine a maximum common mode voltage and a minimum common mode voltage of the sampled common mode voltage and to instruct the skew compensation circuit to adjust the delay of the first signal or the second signal based on the maximum common mode voltage and the minimum common mode voltage.

Example 10 includes the subject matter of any of Examples 1-9, and wherein the skew detection circuit is to sample the common mode voltage at a plurality of sampling time points throughout a period of a receiver clock.

Example 11 includes a system comprising a receiver comprising a skew detection circuit to sample a common mode voltage of a differential signal, wherein the sampled common mode voltage is indicative of an amount of skew between a first signal of the differential signal and a second signal of the differential signal; and a skew compensation circuit to adjust a delay of the first signal or the second signal based on the sampled common mode voltage to reduce the amount of skew; and a transmitter to transmit the differential signal over a pair of communication paths to the receiver.

Example 12 includes the subject matter of Example 11, and wherein the skew compensation circuit comprises a first adjustable capacitor to couple to the first signal and a second adjustable capacitor to couple to the second signal.

Example 13 includes the subject matter of any of Examples 11 and 12, and wherein the skew compensation circuit is to adjust the first or second adjustable capacitor to reduce the amount of skew based on the sampled common mode voltage.

Example 14 includes the subject matter of any of Examples 11-13, and wherein the skew compensation circuit further comprises an analog buffer.

Example 15 includes the subject matter of any of Examples 11-14, and wherein the analog buffer comprises a passive continuous time linear equalizer.

Example 16 includes the subject matter of any of Examples 11-15, and further including a selection circuit to selectively couple an output of the skew compensation circuit to the skew detection circuit or to a receiver path to detect data transmitted by the differential signal.

Example 17 includes the subject matter of any of Examples 11-16, and wherein the skew detection circuit comprises a common mode voltage measurement circuit comprising a feedback resistor, a first resistor coupled to the first signal, and a second resistor coupled to the second signal.

Example 18 includes the subject matter of any of Examples 11-17, and wherein the first and second resistor each have the same resistance value.

Example 19 includes the subject matter of any of Examples 11-18, and wherein the skew detection circuit is to determine a maximum common mode voltage and a minimum common mode voltage of the sampled common mode voltage and to instruct the skew compensation circuit to adjust the delay of the first signal or the second signal based on the maximum common mode voltage and the minimum common mode voltage.

Example 20 includes the subject matter of any of Examples 11-19, and wherein the skew detection circuit is to sample the common mode voltage at a plurality of sampling time points throughout a period of a receiver clock.

Example 21 includes the subject matter of any of Examples 11-20, and further comprising at least one of a battery, display, or network interface controller communicatively coupled to a processor comprising the receiver.

Example 22 includes the subject matter of any of Examples 11-21, and further including a receiver path to detect data transmitted by the differential signal; and a selection circuit to selectively couple an output of the skew compensation circuit to the skew detection circuit or to the receiver path.

Example 23 includes a method comprising sampling a common mode voltage of a differential signal, wherein the sampled common mode voltage is indicative of an amount of skew between a first signal of the differential signal and a second signal of the differential signal; and adjusting a delay of the first signal or the second signal based on the sampled common mode voltage to reduce the amount of skew.

Example 24 includes the subject matter of Example 23, and further including deciding whether to adjust a first capacitor or a second capacitor based on the sampled common mode voltage to reduce the amount of skew.

Example 25 includes the subject matter of any of Examples 23 and 24, and further including selectively coupling the differential signal to a skew detection circuit or a receiver path.

Example 26 includes the subject matter of any of Examples 23-25, and further including determining a maximum and minimum common mode voltage from the sampled common mode voltage and adjusting the delay of the first signal or the second signal based on the maximum and minimum common mode voltages.

Example 27 includes the subject matter of any of Examples 23-26, and wherein sampling the common mode voltage of the differential signal comprises sampling the common mode voltage at a plurality of sampling time points throughout a period of a receiver clock.

Example 28 includes a system comprising first means for sampling a common mode voltage of a differential signal, wherein the sampled common mode voltage is indicative of an amount of skew between a first signal of the differential signal and a second signal of the differential signal; and second means for adjusting a delay of the first signal or the second signal based on the sampled common mode voltage to reduce the amount of skew.

Example 29 includes the subject matter of Example 28, and wherein the first means comprises a first adjustable capacitor to couple to the first signal and a second adjustable capacitor to couple to the second signal.

Example 30 includes the subject matter of any of Examples 28 and 29, and wherein the second means is to adjust the first or second adjustable capacitor to reduce the amount of skew based on the sampled common mode voltage.

Example 31 includes the subject matter of any of Examples 28-30, and wherein the second means further comprises an analog buffer.

Example 32 includes the subject matter of any of Examples 28-31, and wherein the analog buffer comprises a passive continuous time linear equalizer.

Example 33 includes the subject matter of any of Examples 28-32, and further including third means to selectively couple an output of the skew compensation circuit to the skew detection circuit or to a receiver path to detect data transmitted by the differential signal.

Example 34 includes the subject matter of any of Examples 28-33, and wherein the first means comprises a common mode voltage measurement circuit comprising a feedback resistor, a first resistor coupled to the first signal, and a second resistor coupled to the second signal.

Example 35 includes the subject matter of any of Examples 28-34, and wherein the first and second resistor each have the same resistance value.

Example 36 includes the subject matter of any of Examples 28-35, and wherein the first means is to determine a maximum common mode voltage and a minimum common mode voltage of the sampled common mode voltage and to instruct the skew compensation circuit to adjust the delay of the first signal or the second signal based on the maximum common mode voltage and the minimum common mode voltage.

Example 37 includes the subject matter of any of Examples 28-36, and wherein the first means is to sample the common mode voltage at a plurality of sampling time points throughout a period of a receiver clock.

Example 38 includes the subject matter of any of Examples 28-37, and further including fourth means to transmit the differential signal over a pair of communication paths to the second means.

Example 39 includes the subject matter of any of Examples 28-38, and further including a fifth means to detect data transmitted by the differential signal; and a sixth means to selectively couple an output of the skew compensation circuit to the second means or to the fifth means.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   a skew detection circuit to sample a common mode voltage of a differential signal, wherein the sampled common mode voltage is indicative of an amount of skew between a first signal of the differential signal and a second signal of the differential signal;
   a skew compensation circuit to adjust a delay of the first signal or the second signal based on the sampled common mode voltage to reduce the amount of skew; and
   a selection circuit to selectively couple an output of the skew compensation circuit to the skew detection circuit or to a receiver path to detect data transmitted by the differential signal.

2. The apparatus of claim 1, wherein the skew compensation circuit comprises a first adjustable capacitor to couple to the first signal and a second adjustable capacitor to couple to the second signal.

3. The apparatus of claim 2, wherein the skew compensation circuit is to adjust the first or second adjustable capacitor to reduce the amount of skew based on the sampled common mode voltage.

4. The apparatus of claim 2, wherein the skew compensation circuit further comprises an analog buffer.

5. The apparatus of claim 4, wherein the analog buffer comprises a passive continuous time linear equalizer.

6. The apparatus of claim 1, wherein the skew detection circuit comprises a common mode voltage measurement circuit comprising a feedback resistor, a first resistor coupled to the first signal, and a second resistor coupled to the second signal.

7. The apparatus of claim 6, wherein the first and second resistor each have the same resistance value.

8. The apparatus of claim 1, wherein the skew detection circuit is to determine a maximum common mode voltage and a minimum common mode voltage of the sampled common mode voltage and to instruct the skew compensation circuit to adjust the delay of the first signal or the second signal based on the maximum common mode voltage and the minimum common mode voltage.

9. The apparatus of claim 1, wherein the skew detection circuit is to sample the common mode voltage at a plurality of sampling time points throughout a period of a receiver clock.

10. A system comprising:
    a receiver comprising:
       a skew detection circuit to sample a common mode voltage of a differential signal, wherein the sampled common mode voltage is indicative of an amount of skew between a first signal of the differential signal and a second signal of the differential signal;
       a skew compensation circuit to adjust a delay of the first signal or the second signal based on the sampled common mode voltage to reduce the amount of skew;
       a receiver path to detect data transmitted by the differential signal; and
       a selection circuit to selectively couple an output of the skew compensation circuit to the skew detection circuit or to the receiver path; and
    a transmitter to transmit the differential signal over a pair of communication paths to the receiver.

11. The system of claim 10, wherein the skew compensation circuit comprises a first adjustable capacitor to couple to the first signal and a second adjustable capacitor to couple to the second signal.

12. The system of claim 11, wherein the skew compensation circuit is to adjust the first or second adjustable capacitor to reduce the amount of skew based on the sampled common mode voltage.

13. The system of claim 10, further comprising at least one of a battery, display, or network interface controller communicatively coupled to a processor comprising the receiver.

14. A method comprising:
    sampling a common mode voltage of a differential signal, wherein the sampled common mode voltage is indicative of an amount of skew between a first signal of the differential signal and a second signal of the differential signal;

adjusting a delay of the first signal or the second signal based on the sampled common mode voltage to reduce the amount of skew; and selectively coupling the differential signal to a skew detection circuit or a receiver path.

15. The method of claim 14, further comprising deciding whether to adjust a first capacitor or a second capacitor based on the sampled common mode voltage to reduce the amount of skew.

16. The method of claim 14, further comprising determining a maximum and minimum common mode voltage from the sampled common mode voltage and adjusting the delay of the first signal or the second signal based on the maximum and minimum common mode voltages.

17. The method of claim 14, wherein sampling the common mode voltage of the differential signal comprises sampling the common mode voltage at a plurality of sampling time points throughout a period of a receiver clock.

\* \* \* \* \*